(12) United States Patent
Zhu et al.

(10) Patent No.: US 11,832,411 B2
(45) Date of Patent: Nov. 28, 2023

(54) NODE SAFE LOCKING DEVICE, AND SERVER

(71) Applicant: INSPUR SUZHOU INTELLIGENT TECHNOLOGY CO., LTD., Jiangsu (CN)

(72) Inventors: Jingxian Zhu, Jiangsu (CN); Zhencai Cao, Jiangsu (CN); Ying Qian, Jiangsu (CN); Zhanyang Li, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/026,334

(22) PCT Filed: Nov. 30, 2021

(86) PCT No.: PCT/CN2021/134199
§ 371 (c)(1),
(2) Date: Mar. 14, 2023

(87) PCT Pub. No.: WO2022/252522
PCT Pub. Date: Dec. 8, 2022

(65) Prior Publication Data
US 2023/0262916 A1    Aug. 17, 2023

(30) Foreign Application Priority Data

Jun. 3, 2021   (CN) .......................... 202110617964.0

(51) Int. Cl.
*H05K 7/14*    (2006.01)
(52) U.S. Cl.
CPC ......... *H05K 7/1402* (2013.01); *H05K 7/1489* (2013.01)

(58) Field of Classification Search
CPC .. H05K 7/1402; H05K 7/1489; H05K 7/1487; H05K 7/1409; H05K 7/1411; H05K 7/1485
See application file for complete search history.

(56) References Cited

U.S. PATENT DOCUMENTS

2011/0280507 A1*  11/2011  Yu ........................ H05K 7/1489
                                                        384/21
2012/0061551 A1*  3/2012  Zhang ................... H05K 7/183
                                                        248/560

(Continued)

FOREIGN PATENT DOCUMENTS

CN        102578843 A       7/2012
CN        109157021 A       1/2019

(Continued)

OTHER PUBLICATIONS

PCT/CN2021/134199 international search report.
CN 202110617964.0 first office action.

*Primary Examiner* — James Wu
*Assistant Examiner* — Christopher L Augustin
(74) *Attorney, Agent, or Firm* — IPro, PLLC (57) ABSTRACT

The present disclosure discloses a node safe locking device and a server. An outer rail is disposed between two adjacent node modules. A middle rail is slidably assembled at the outer rail. Each middle rail is driven by one node module to translate in a same direction. When the middle rail moves, the linking and interlocking rod may be driven to reach different positions. When the middle rail moves outwards from the initial position together with one of the node modules, the locking guiding lean edge drives the linking and interlocking rod to move to the locking position. At this time, the blocking locking edge of the middle rail corresponding to the other node module is blocked by the linking (Continued)

and interlocking rod located at the locking position, and the node module may not move outwards to realize locking.

19 Claims, 11 Drawing Sheets

(56) References Cited

U.S. PATENT DOCUMENTS

| 2016/0219748 A1* | 7/2016 | Tsai | H05K 7/1487 |
| 2020/0154592 A1* | 5/2020 | Wu | F16B 5/0052 |
| 2020/0187650 A1 | 6/2020 | Ng | |

FOREIGN PATENT DOCUMENTS

| CN | 208403740 U | 1/2019 |
| WO | 2019039935 A1 | 2/2019 |

\* cited by examiner

NODE SAFE LOCKING DEVICE, AND SERVER

CROSS-REFERENCE TO RELATED APPLICATION

The present disclosure claims the priority of the Chinese patent application filed on Jun. 3, 2021 before the CNIPA, China National Intellectual Property Administration with the application number of 202110617964.0 and the title of "NODE SAFE LOCKING DEVICE, AND SERVER", which is incorporated herein in its entirety by reference.

FIELD

The present disclosure relates to the technical field of servers, and more particularly, relates to a node safe locking device and a server.

BACKGROUND

In the server, there are usually at least two node modules installed inside, and each node module may be pulled out from the server. When two or more node modules are pulled out at the same time, the gravity center of the server is caused to shift to the outside of the server housing, which will easily cause the server to topple.

Therefore, during operation, the operator is required to take time to pay attention not to pull out two node modules at the same time, but it is difficult to ensure that there are no errors due to manual operation, as a result, the problem of server toppling occurs from time to time, especially when testing is performed in the laboratory, the server is not installed on the server rack, and toppling is more likely to occur.

At present, in the field of furniture, in order to prevent two drawers from being pulled out at the same time, a locking structure is also provided. The existing structural solution for preventing the drawers from being pulled out at the same time occupies the space on both sides of the front end. However, for a structure that the front space and the left and right spaces of the node in the lateral array server are limited, such as a chassis with a height of 1 U or 2 U, the sides of which are occupied by the slide rails, so the existing technical solution may not be used. In addition, under certain conditions, the internal module of the server node needs to be maintained from the side surface, the space on the side edge of the server node may not be occupied by the linkage interlock structure or the slide rail, otherwise the maintenance to the internal portion of the node module will be affected.

SUMMARY

The present disclosure provides a node safe locking device, which prevents other corresponding node modules from being pulled out when one node module is pulled out, reduces the risk of server toppling, and does not occupy the space on both sides of the front end of the node module. The solution is as follows:

A node safe locking device, wherein the node safe locking device includes an outer rail disposed between two adjacent node modules, and the outer rail is provided with a guiding hole, a linking and interlocking rod is slidably assembled in the guiding hole, and the linking and interlocking rod is movable in a direction perpendicular to its own axis; the linking and interlocking rod is coordinated with the two adjacent node modules to realize locking or unlocking;

a middle rail is slidably assembled at the outer rail, and the middle rail is driven by one of the two adjacent node modules to translate in a same direction;

the middle rail is provided with a locking guiding lean edge, an unlocking guiding lean edge and a blocking locking edge;

when the middle rail moves outwards from an initial position, the locking guiding lean edge drives the linking and interlocking rod to move to a locking position; when the middle rail moves inwards to the initial position, the unlocking guiding lean edge drives the linking and interlocking rod to move to an unlocking position; and when the middle rail is located at the initial position, the blocking locking edge is blocked by the linking and interlocking rod at the locking position, so that a corresponding node module is not capable to move outwards.

In some embodiments, a damping block is fixedly assembled at the outer rail, and the damping block is provided with two position-limiting arcs, the damping block is configured to elastically limit the position of the linking and interlocking rod in the locking position and the unlocking position; and when the linking and interlocking rod moves between the locking position and the unlocking position, damping is generated.

In some embodiments, a middle rail stop nail is assembled at the middle rail, and the outer rail is provided with a stop guiding edge; and when the stop guiding edge blocks the middle rail stop nail, an outermost position that the middle rail moves to is defined.

In some embodiments, the middle rail is slidably connected to an inner rail, and the inner rail is fixedly connected to the node module;

a stop hook is assembled at the inner rail, and the stop hook is capable to drive the middle rail stop nail to allow the middle rail to move outward together with the node module at the same time;

the middle rail is provided with a middle rail stop slideway, and the middle rail stop nail is slidably mounted in the middle rail stop slideway and the middle rail stop nail is capable to move to a stop position and a movable position;

when the middle rail moves outwardly to the outermost position, the stop guiding edge causes the middle rail stop nail to move to the movable position; and when the middle rail stop nail is located at the stop position, the middle rail stop nail contacts and cooperates with the stop hook; and when the middle rail stop nail is located at the movable position, the middle rail stop nail stops cooperating with the stop hook, and the inner rail is capable to move independently with respect to the middle rail.

In some embodiments, the inner rail is provided with a stop reset lean edge, and when the inner rail moves inward together with the node module, the stop reset lean edge drives the middle rail stop nail to the stop position.

In some embodiments, a return spring is assembled at the middle rail, and the return spring applies a lifting elastic force to the middle rail stop nail.

In some embodiments, a side surface of the middle rail is protruded with a stopper, and the stopper is closer to an outer extending end compared with the middle rail stop nail; and the stopper is configured to block the stop hook to prevent the inner rail from completely separating from the middle rail.

In some embodiments, the stop hook includes a stop pushing surface, a returning elastic arm, a rotating connecting element, a pressing arm, and the stop pushing surface is configured to achieve a stop function with the cooperation of the middle rail stop nail or the stopper; and the stop hook is rotatably connected to the inner rail through the rotating connecting element; and the stop hook is capable to rotate around the rotating connecting element by pressing the pressing arm, and the returning elastic arm produces elastic deformation by squeezing the returning elastic arm; and when external force is released, the position of the stop hook is restored by the returning elastic arm.

In some embodiments, two outer rails are fixedly connected backwards, and an upper edge the outer rail and a lower edge of the outer rail are respectively bent backwards to form position-position-limiting fold edges;

the middle rail is slidably assembled at the outer rail; an upper edge of the middle rail and a lower edge of the middle rail are respectively bent backwards to form a position-limiting fold edge; and upper edges and lower edges of main parts of two inner rails are respectively bent relative to each other to form position-limiting fold edges; and the position-limiting fold edges of the inner rails are slidably assembled in the position-limiting fold edge of the middle rail.

In some embodiments, the node safe locking device further includes an unlocking connecting rod, and an extending direction of the unlocking connecting rod is parallel to a moving direction of the node module; and an inner extending end of the unlocking connecting rod is provided with an unlocking lean edge and the unlocking lean edge drives the linking and interlocking rod to move from the locking position to the unlocking position when the unlocking connecting rod moves along an unlocking direction.

In some embodiments, an outer extending end of the unlocking connecting rod is rotatably connected to an unlocking handle, and when the unlocking handle is rotated, the unlocking connecting rod is driven to move outward in a direction parallel to the node module to realize unlocking.

The present disclosure further provides a server including the node safe locking device as described in any one of the embodiments described above.

The present disclosure provides a node safe locking device. An outer rail is arranged between two adjacent node modules, and a linking and interlocking rod is movable in a direction perpendicular to its own axis. A middle rail is slidably assembled at the outer rail; each middle rail is driven by one node module to translate in a same direction. When the middle rail moves, the linking and interlocking rod may be driven to reach different positions. When the middle rail moves outwards from the initial position together with one node module, the locking guiding lean edge drives the linking and interlocking rod to move to the locking position. At this time, the blocking locking edge of the middle rail corresponding to the other node module is blocked by the linking and interlocking rod located in the locking position, and the node module may not move outwards to achieve locking. When the middle rail moves inwards to the initial position, the unlocking guiding lean edge drives the linking and interlocking rod to move to the unlocking position. At this time, the linking and interlocking rod does not block any middle rail, and any node module may be normally pulled out. The device ensures that the node modules cannot be pulled out at the same time under the condition that the space on both sides of the front end of the node module are not occupied, and it reduces the possibility of falling.

BRIEF DESCRIPTION OF THE DRAWINGS

In order to more clearly explain the technical solution in the embodiment or the existing technology of the present disclosure, the following will briefly introduce the drawings that need to be used in the embodiment or the existing technology description. Obviously, the drawings in the following description are only some embodiments of the present disclosure. For a person skilled in the art, other drawings may be obtained according to the provided drawings without paying creative labor.

ELEMENTS AND REFERENCE NUMBERS

Outer rail 1, guiding hole 11, damping block 12, position-limiting arc 121, stop guiding edge 13, linking and interlocking rod 2, middle rail 3, locking guiding lean edge 31, unlocking guiding lean edge 32, blocking locking edge 33, middle rail stop nail 34, middle rail stop slide 35, stopper 36, return spring 37, inner rail 4, stop hook 41, stop pushing surface 411, returning elastic element 413, rotating connecting element 413, pressing arm 414, stop reset lean edge 42, unlocking connecting rod 5, unlocking lean edge 51 and unlocking handle 52.

DETAILED DESCRIPTION

The core of the present disclosure is to provide a node safe locking device, which prevents other corresponding node modules from being pulled out when one node module is pulled out without occupying the space on both sides of the front end of the node module, and reduces the risk of the server toppling.

In order to enable those skilled in the art to better understand the technical solution of the present disclosure, a detailed description and explanation of the node safe locking device of the present disclosure will be given below in combination with the drawings and embodiments.

Figure 1A:
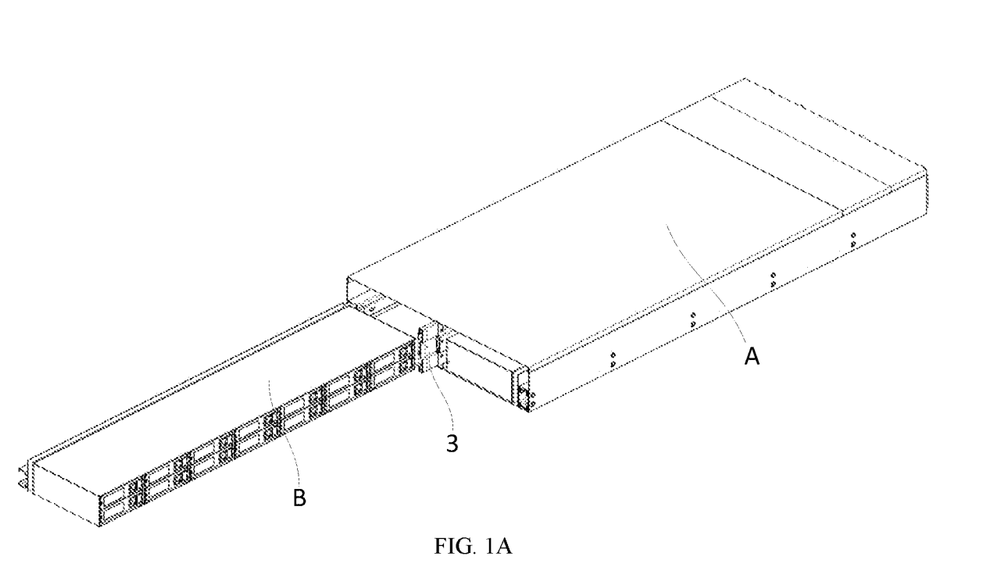
FIG. 1A is a structural diagram of the assembly of the node safe locking device and the chassis.
Figure 1B:
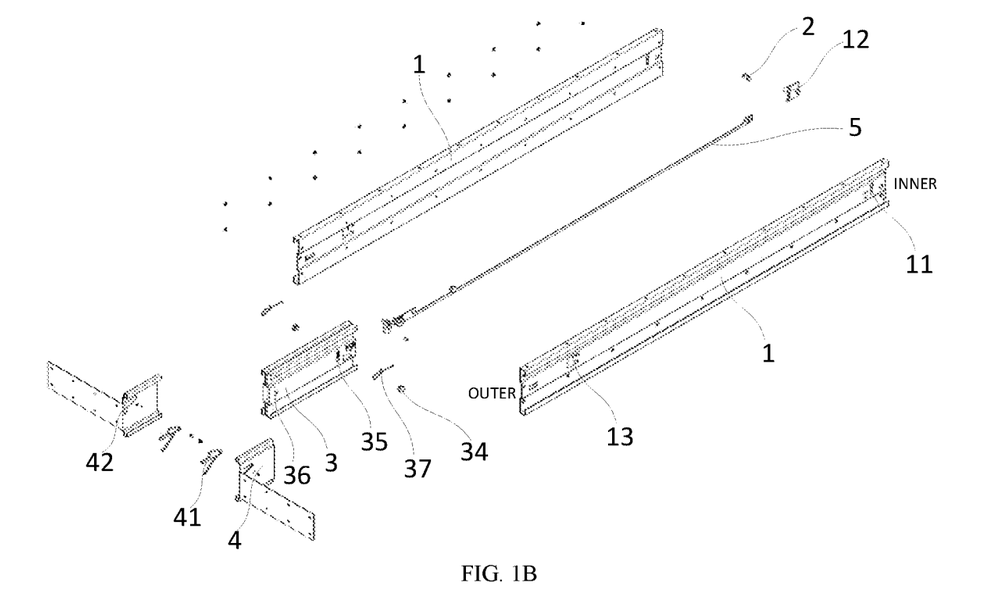
FIG. 1B is an explosion diagram of components of the node safe locking device.
Figure 1C:
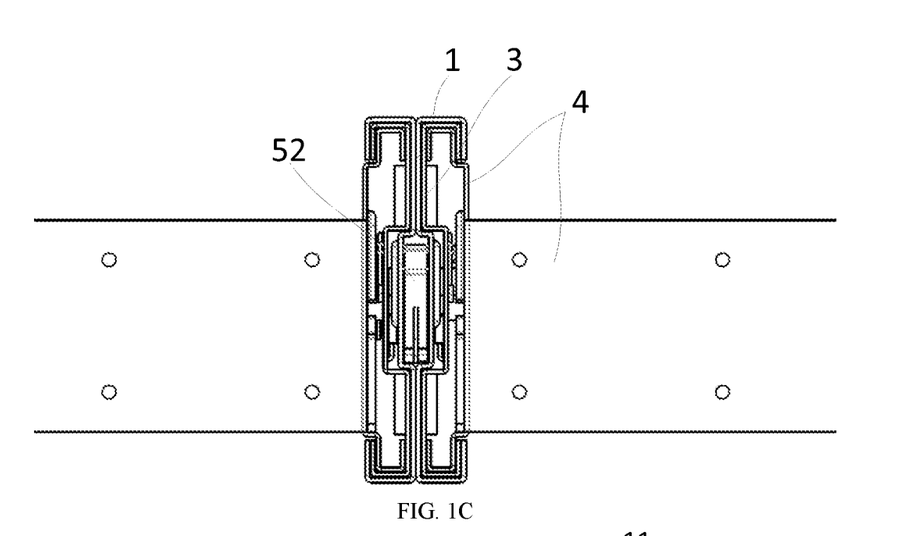
FIG. 1C is a front view of the node safe locking device in an assembled state seen from the outside of the node safe locking device.

The present disclosure provides a node safe locking device. As shown in FIG. 1A, FIG. 1A is a structural diagram of the assembly of the node safe locking device and the chassis. In the figures, A represents a chassis and B represents a node module. FIG. 1B is an explosion diagram of components of the node safe locking device; FIG. 1C is a front view of the node safe locking device in an assembled state seen from the outside of the node safe locking device. The device includes an outer rail 1 and the outer rail 1 is fixedly assembled at the chassis and disposed between two adjacent node modules for guiding and limiting the position. Each node module corresponds to one outer rail 1, and the two outer rails 1 are relatively fixedly arranged to form a whole body. The outer rail 1 is provided with a guiding hole 11, a linking and interlocking rod 2 is slidably assembled in the guiding hole. The linking and interlocking rod 2 may move along the guiding hole 11 to change its own position and the linking and interlocking rod 2 may move to an unlocking position and a locking position. The moving path of the linking and interlocking rod 2 is perpendicular to the length direction of itself.

The movement of the linking and interlocking rod 2 is related to the node modules, and one linking and interlocking rod 2 cooperates with the two node modules. When the linking and interlocking rod 2 is in the unlocking position, each node module is not blocked and may be pulled out independently. When the linking and interlocking rod 2 is in the locking position, the linking and interlocking rod 2 blocks the node module that is not pulled out. At this time, the node module that is not pulled out at the initial position may not be pulled out outward. The initial position is the position where components are located when the node module is completely retracted into the chassis.

Figure 2A:
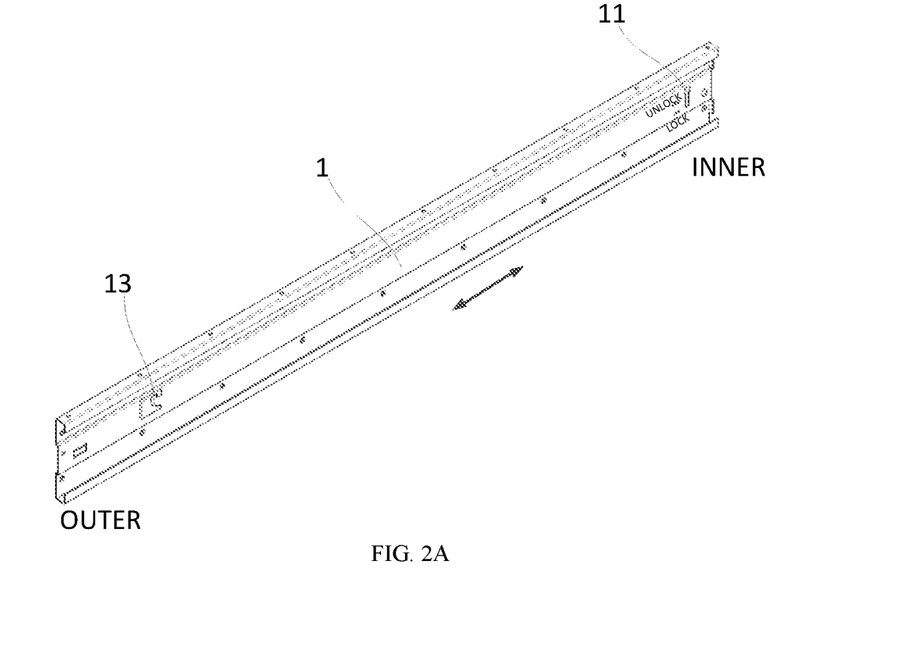
FIG. 2A is a schematic diagram showing the structure of the outer rail in the node safe locking device.

A middle rail 3 is slidably assembled at the outer rail 1; each middle rail 3 is driven by one node module to translate in a same direction; and the moving direction of the middle rail 3 is parallel to the moving direction of the node module. The middle rail 3 may move relative to the outer rail 1, and the middle rail 3 is driven by the node module. As shown in FIG. 2A, FIG. 2A is a schematic diagram showing the structure of the outer rail 1 in the node safe locking device, with OUTER representing the outer end and INNER representing the inner end. The middle rail 3 moves in the direction indicated by the two-way arrows in the figure, that is, the moving direction of the middle rail 3 is consistent with a length direction of the outer rail 1. As shown in FIG. 1C, the two outer rails 1 contact each other, and structures such as a middle rail 3 is installed between the two outer rails 1. The guiding hole 11 penetrates through the outer rail 1, and the guiding direction of the guiding hole 11 is along the vertical direction shown in FIG. 2A; the linking and interlocking rod 2 penetrates through and inserts into the guiding hole 11 and slides along the vertical direction; the moving direction of the linking and interlocking rod 2 is perpendicular to the moving direction of the middle rail 3; and in FIG. 2A, the lower portion of the guiding hole 11 is a locking position (LOCK) and the upper portion of the guiding hole 11 is an locking position (UNLOCK).

Figure 2B:
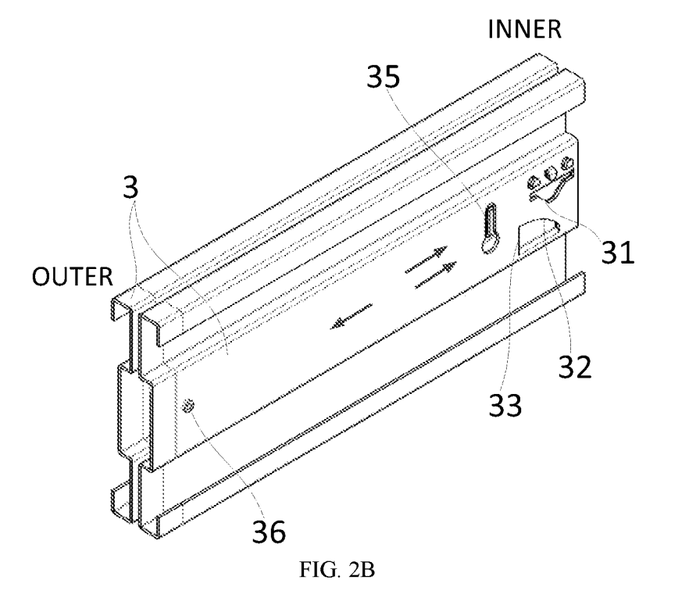
FIG. 2B is a schematic diagram showing the structure of the middle rail in the node safe locking device.

As shown in FIG. 2B, FIG. 2B is a schematic diagram showing the structure of the middle rail 3 in the node safe locking device, and the figure shows two middle rails 3. The middle rail 3 is respectively provided with a locking guiding lean edge 31, an unlocking guiding lean edge 32 and a blocking locking edge 33. The locking guiding lean edge 31, the unlocking guiding lean edge 32 and the blocking locking edge 33 are external convex structures protruding from the plate surface of the middle rail 3 respectively; the locking guiding lean edge 31 and the unlocking guiding lean edge 32 are linear-shaped or arc-shaped structures arranged obliquely; the blocking locking edge 33 is a vertical structure.

When the middle rail 3 moves outward from the initial position, the locking guiding lean edge 31 drives the linking and interlocking rod 2 to move to the locking position. When the middle rail 3 moves inwards to the initial position, the unlocking guiding lean edge 32 drives the linking and interlocking rod 2 to move to an unlocking position. When the middle rail 3 is in the initial position, the blocking locking edge 33 is blocked by the linking and interlocking rod 2 located at the locking position, so that a corresponding node module may not move outwards.

As shown in combination with FIG. 2B, when the middle rail 3 moves toward the lower left along the single arrow in the FIG. 2B, that is, the middle rail moves outwardly together with the node module. Since the locking guiding lean edge 31 is arranged obliquely, the locking guiding lean edge 31 applies a downward pushing force on the linking and interlocking rod 2 to move the linking and interlocking rod 2 downwardly to the locking position. When the linking and interlocking rod 2 is located at the locking position, the linking and interlocking rod 2 is position-limited by the guiding hole 11 and may not move along the length direction of the outer rail 1, so the linking and interlocking rod 2 is capable to block the middle rail 3 located at the initial position from moving outwards and further to block the node module from moving outwards.

When the middle rail 3 moves toward the upper right along the double arrows in the figure, that is, the middle rail moves inwards together with the node module. Since the unlocking guiding lean edge 32 is arranged obliquely, the unlocking guiding lean edge 32 applies an upward pushing force on the linking and interlocking rod 2 to move the linking and interlocking rod 2 upwards to the unlocking position.

Figure 3A:
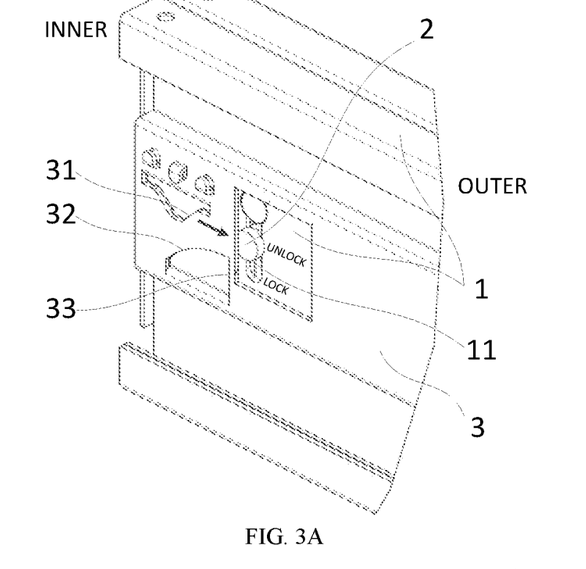
FIG. 3A and FIG. 3B are schematic diagrams of the linking and interlocking rod located at an unlocking position and a locking position, respectively.
Figure 3B:
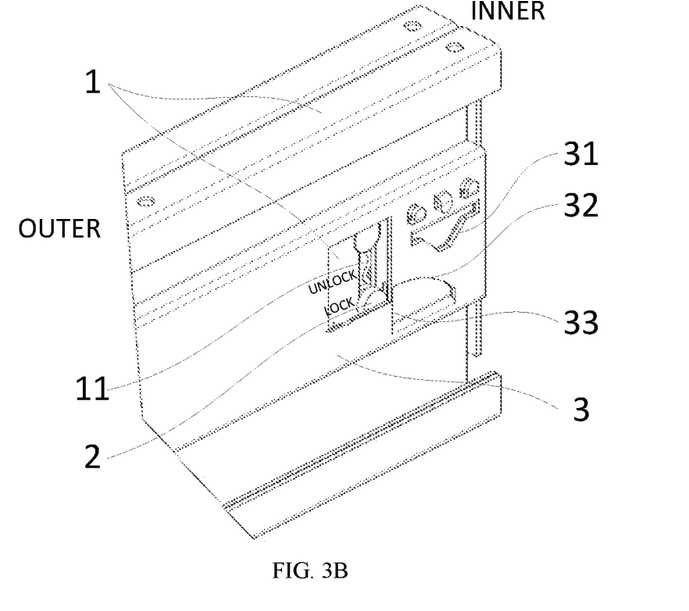

As shown in FIGS. 3A and 3B, FIGS. 3A and 3B are schematic diagrams of the linking and interlocking rod 2 located at an unlocking position and a locking position, respectively. FIGS. 3A and 3B show two different middle rails, respectively. FIG. 3A is equivalent to viewing from a first side and FIG. 3B is equivalent to viewing from the second side. As shown in FIG. 3A, when the node module located on the first side is pulled out, the middle rail 3 on the first side moves rightwards along the arrow, the locking guiding lean edge 31 moves rightwards to contact with the linking and interlocking rod 2, which may only move vertically up and down, and the locking guiding lean edge 31 pushes the linking and interlocking rod 2 to move downwards sequentially to make the linking and interlocking rod reach the locking position in the state of FIG. 3B.

As shown in connection with FIG. 3B, seen from the second side, the middle rail 3 located on the second side is in an initial position. When the linking and interlocking rod 2 moves downward to reach the locking position, the linking and interlocking rod 2 is located on the outside of the blocking locking edge 33. The blocking locking edge 33 may not move outward due to be blocked by the linking and interlocking rod 2. Further, the middle rail 3 of the second side may not move outward.

The linking and interlocking rod 2 of the present disclosure is associated with two node modules, each node module may independently drive the linking and interlocking rod 2 to change the position of the linking and interlocking rod 2. When one of the node modules is pulled out, the linking and interlocking rod 2 is driven to move to the locking position, thus restricting the other node modules from being pulled out. When the node module pulled out is pushed back again, the linking and interlocking rod 2 is driven to move from the locking position to the unlocking position, and at this time, any node module may be moved independently. The device may prevent two node modules from moving out of the server at the same time, avoiding the toppling problem of the server.

Figure 2C:
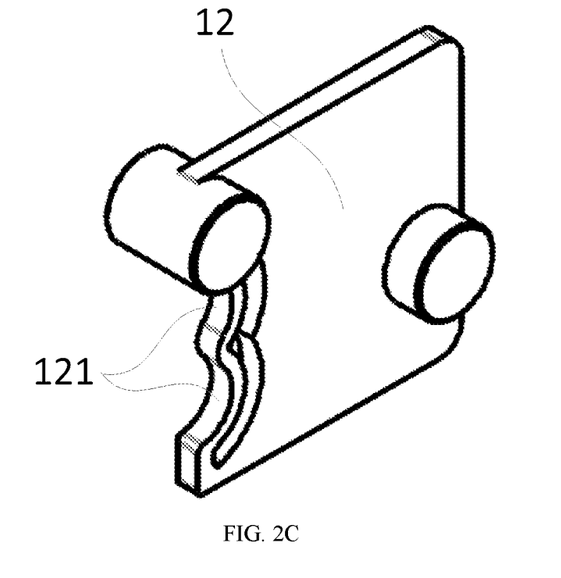
FIG. 2C is a schematic diagram showing the structure of the damping block.

A damping block 12 is fixedly assembled at the outer rail 1, as shown in FIG. 2C, FIG. 2C is a structural schematic diagram of the damping block 12. The damping block 12 is configured to elastically limit the position of the linking and interlocking rod 2 in a locking position and an unlocking position. When the linking and interlocking rod 2 moves between the locking position and the unlocking position, damping is generated. The damping block 12 is a plate-shaped structure and may be made of plastic material. Two position-limiting arcs 121 are arranged at one of the side edges of the damping block 12. The position-limiting arcs 121 match the shape of the periphery of the linking and interlocking rod 2. When the linking and interlocking rod 2 moves in the guiding hole 11, it transfers between the two position-limiting arcs 121. When the linkages interlock rod 2 is within one of the position-limiting arcs 121, the linkages interlock rod 2 basically does not generate pressure on the position-limiting arc 121. When the linking and interlocking rod 2 moves from one position-limiting arc 121 to the other position-limiting arc 121, it needs to pass over the protruding structure between the two position-limiting arcs 121. At this time, pressure is generated on the protruding structure and certain resistance is generated to the movement of the linking and interlocking rod 2, so as to prevent the abnormal deviation of the position of the linking and interlocking rod 2. In the absence of other external forces, the linkage interlock lever 2 is just at the position of one of the two position-limiting arcs 121.

The damping block 12 is stuck at the position between the two outer rails 1, and is inserted on the two outer rails 1 through two sets of positioning posts protruding from the plate surfaces of the damping block 12, so that the damping block 12 and the outer rails 1 are relatively fixed. Although the damping block 12 is made of plastic material and has certain elasticity, in order to make the linking and interlocking rod 2 more easily transfer between the two position-limiting arcs 121, only the two ends of the two position-limiting arcs 121 are connected as a whole with the body of the damping block 12, and the middle part is not in contact with the body of the damping block 12, so the position-limiting arcs 121 are more easily deformed. Of course, if the damping block 12 itself is made of a material with better elasticity such as rubber, it is not necessary to dispose such a gap structure.

The middle rail 3 is provided with a middle rail stop nail 34 which may not move relative to the length direction of the middle rail 3 itself, and the middle rail stop nail 34 and the middle rail 3 slide along the length direction of the outer rail 1 at a same time. As shown in FIG. 2A, a stop guiding edge 13 is disposed on the outer rail 1, and the stop guiding edge 13 protrudes from the side of the outer rail 1 in the direction of facing the middle rail 3, and the stop guiding edge 13 is located at the position of the outer rail 1 close to the outer end. When the stop guiding edge 13 blocks the middle rail stop nail 34, an outermost position that the middle rail 3 moves to is defined, and when the middle rail moves outward together with the node module, the middle rail moves to the lower left portion of FIG. 2A, and when the middle rail stop nail 34 is blocked by the stop guiding edge 13, the middle rail stop nail 34 may not continue to move outward to prevent the middle rail 3 from completely separating from the outer rail 1.

Figure 2D:
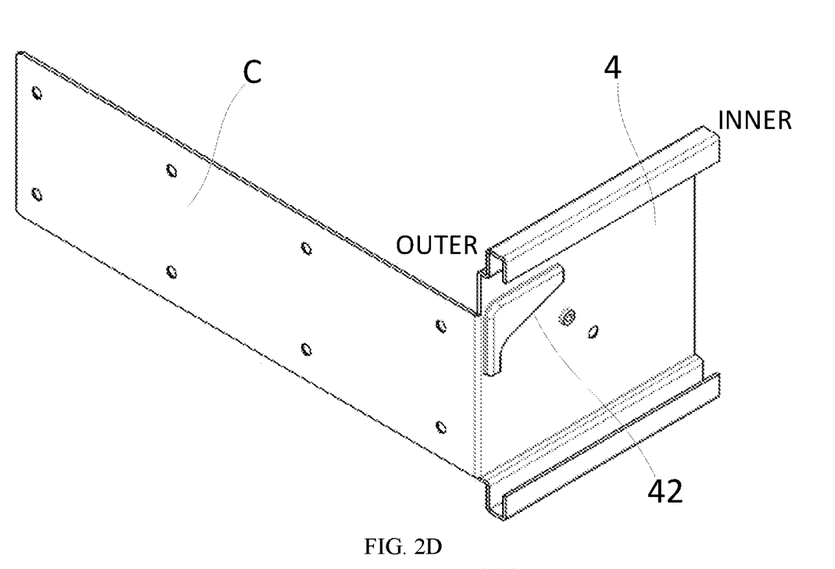
FIG. 2D is a diagram showing the structure of the inner rail of the node safe locking device.

Further, the inner rail 4 is slidably connected to the middle rail 3 in the present disclosure. As shown in FIG. 2D, FIG. 2D is a diagram showing the structure of the inner rail of the node safe locking device. The inner rail 4 is fixedly connected to the node module and moves synchronously with the node module at a same time. In FIG. 2D, C represents a connecting plate for fixing to the inner end of the node module. The connecting plate is perpendicular to the main part of the inner rail 4. The main part of the inner rail 4 is rear connected to the middle rail 3.

Figure 2E:
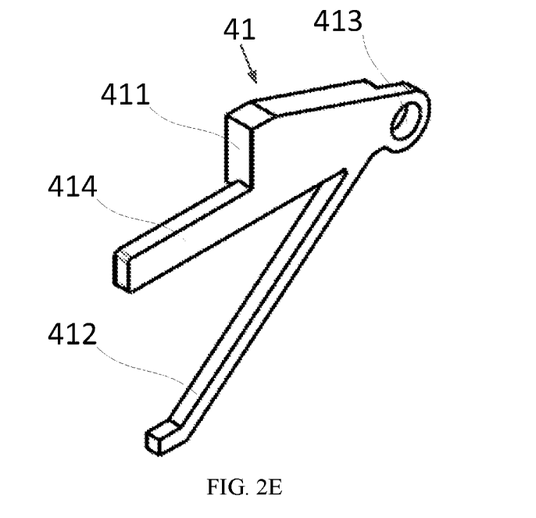
FIG. 2E is a schematic diagram showing the structure of the stop hook.

A stop hook 41 is disposed on the inner rail 4. FIG. 2E is a structural schematic diagram of the stop hook 41. The stop hook 41 may drive the middle rail stop nail 34 to make the middle rail 3 move outward together with the node modules.

As shown in FIG. 2B, the middle rail 3 is provided with a middle rail stop slideway 35, which penetrates the middle rail 3 in the vertical direction and the transverse direction, and a middle rail stop nail 34 is slidably assembled at the middle rail stop slideway 35. The middle rail stop nail 34 may slide in the vertical direction, and may reach a stop position and a movable position when the middle rail stop nail 34 moves relative to the middle rail stop slipway 35. When the middle rail 3 moves outwards to the outermost position, the stop guiding edge 13 pushes the middle rail stop nail 34 to move the middle rail stop nail 34 to a movable position. When the middle rail stop nail 34 is located at the stop position, the middle rail stop nail 34 contacts and cooperates with the stop hook 41 to form a block to the stop hook 41, and further prevents the inner rail from continuing to move outwards. When the middle rail stop nail 34 is in the movable position, the middle rail stop nail 34 stops cooperating with the stop hook 41. The stop hook 41 is not blocked by the middle rail stop nail 34. The inner rail may continue to move outwardly. The inner rail 4 moves independently relative to the middle rail 3.

As shown in FIG. 2D, the inner rail 4 is provided with a stop reset lean edge 42. When the inner rail 4 moves inward together with the node module, the stop reset lean edge 42 drives the middle rail stop nail 34 to move to the stop position. At this time, the middle rail stop nail 34 re-blocks the movement of the stop hook 41.

A return spring 37 is assembled at the middle rail 3, and the return spring 37 applies a lifting elastic force to the middle rail stop nail 34. The return spring 37 applies an upward elastic force to the middle rail stop nail 34 to avoid the middle rail stop nail 34 from falling down.

The side surface of the middle rail 3 is protruded with a stopper 36 and the stopper 36 protrudes from the side surface of the middle rail 3. The stopper 36 is closer to an outer extending end compared with the middle rail stop nail 34. When the middle rail stop nail 34 is pushed to the movable position by the stop guiding edge 13, the stop hook 41 continues to move outwards without being blocked by the middle rail stop nail 34. At this time, the inner rail 4 may move relative to the middle rail 3. In order to avoid the inner rail 4 completely separating from the middle rail 3, a stopper 36 is disposed on the middle rail 3 and the stopper 36 is fixed on the middle rail 3. The stopper 36 is configured to block the stop hook 41 and prevent the inner rail 4 from completely separating from the middle rail 3.

Figure 4A:
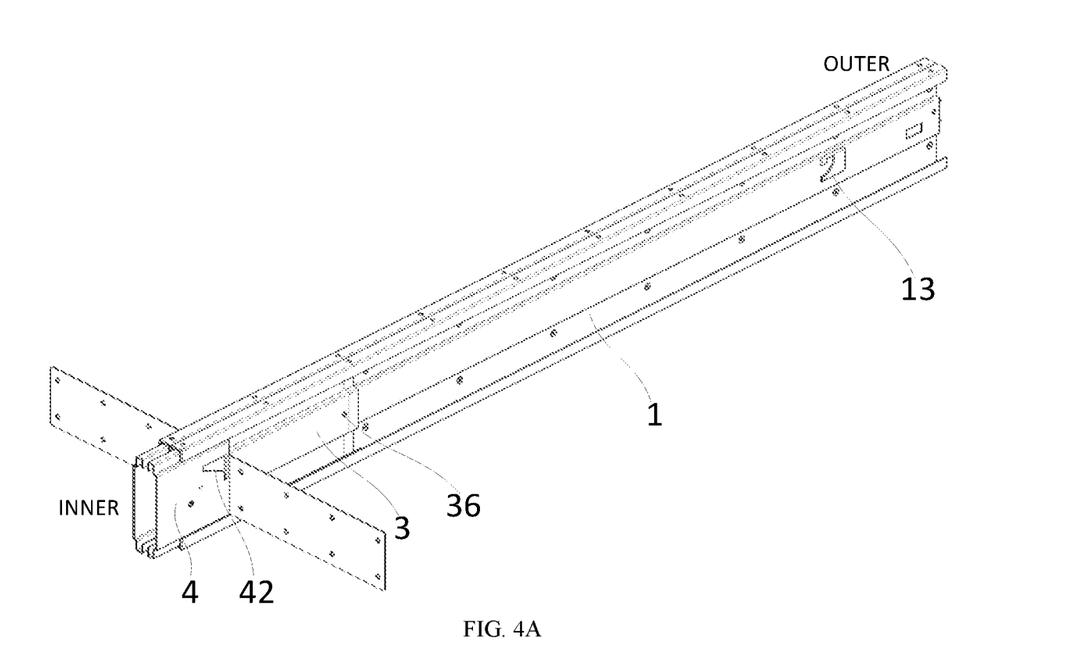
FIG. 4A is a schematic diagram of the node safe locking device of the present disclosure in an initial state.
Figure 4B:
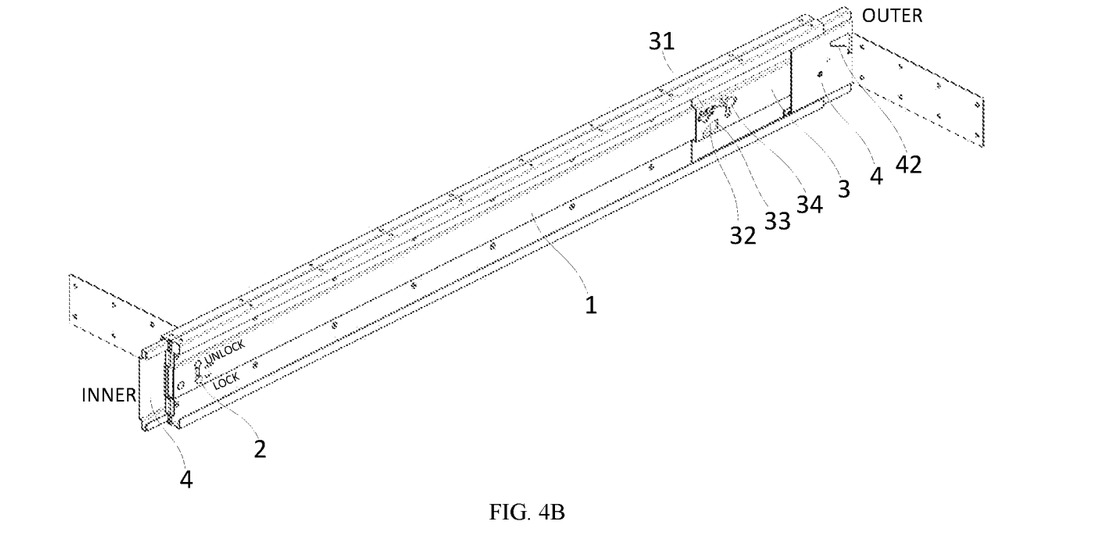
FIG. 4B is a schematic diagram of an outwardly pulled-out state of the inner rail and the middle rail at one side of the node safe locking device of the present disclosure.
Figure 5A:
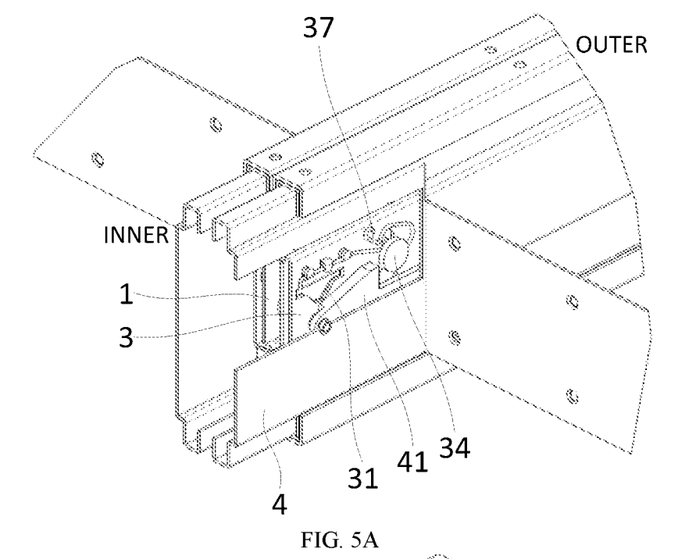
FIG. 5A is a partial schematic diagram of the inner end portion of the inner node safe locking device in the initial state.
Figure 5B:
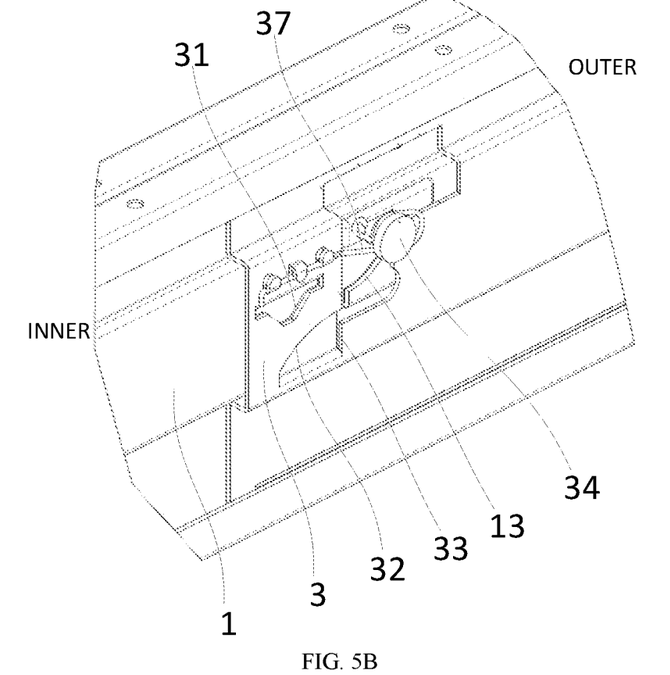
FIG. 5B is a partial schematic diagram of the cooperation state of the middle rail stop nail and the stop guiding edge.
Figure 5C:
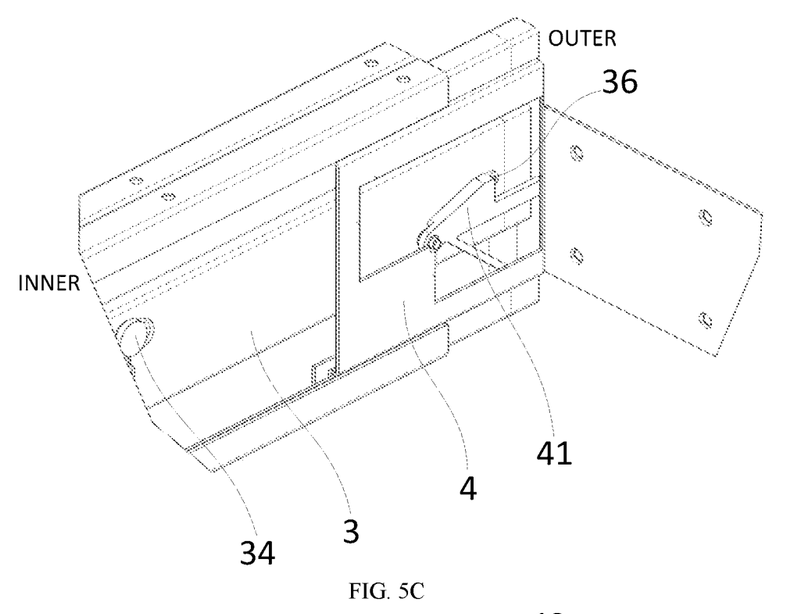
FIG. 5C is a partial structural diagram of the cooperation of the middle rail stop nail and the stopper.

FIG. 4A is a schematic diagram of a node safe locking device of the present disclosure in an initial state, and FIG. 4B is a schematic diagram in an outwardly pulled-out state of an inner rail and a middle rail at one side of a node safe locking device of the present disclosure; FIG. 5A is partial schematic diagram of the inner end portion of the inner node safe locking device in the initial state, which is equivalent to the partial structure of the left side of FIG. 4A. FIG. 5B is a partial schematic diagram of the cooperation state of the middle rail stop nail and the stop guiding edge. FIG. 5C is a partial diagram of the middle rail stop nail 34 cooperating with the stopper 36.

Referring to FIGS. 4A, 4B, 5A to 5C, in the initial position of FIG. 5A, the middle rail stop nail 34 is located at the lower stop position. At this time, the stop hook 41 is topped on the middle rail stop nail 34. The node module moves synchronously with the inner rail 4, and the inner rail 4 drives the middle rail 3 to move outward synchronously through the transmission of the stop hook 41 and the middle rail stop nail 34.

The inner rail 4 drives the middle rail 3 to move outward synchronously. When the middle rail stop nail 34 contacts the stop guiding edge 13, the lean edge of the stop guiding edge 13 pushes the middle rail stop nail 34 to move upward to a movable position. At this time, the inner rail 4 is capable to move independently relative to the middle rail 3.

The inner rail 4 continues to move outwards to reach the position shown in FIG. 5C and is blocked by the stopper 36, at this time, the inner rail 4 may not continue to move outwards. At this time, the middle rail 3 is blocked by the stop guiding edge 13 on the outer rail 1 and may not move outwards, and the inner rail 4 is blocked by the stopper 36 on the middle rail 3, at this time the node module moves outwards to the maximum position.

Referring to FIG. 2E, the stop hook 41 includes a stop pushing surface 411, a returning elastic arm 412, a rotating connecting element 413, and a pressing arm 414. The stop pushing surface 411 is a vertical surface, and the pressing arm 414 extends outwardly in a transverse direction. The stop pushing surface 411 is used to stop in cooperation with the middle rail stop nail 34 or the stopper 36.

The stop hook 41 is rotatably connected to the inner rail 4 by a rotating connecting element 413. The stop hook 41 may only rotate and may not be moved relative to the inner rail 4. The pressing arm 414 extends outwards and may be pressed by the operator when the inner rail 4 moves outwards to the maximum position. Applying downward pressure to the pressing arm 414 may make the stop hook 41 rotate around the rotating connecting element 413. One end of the returning elastic arm 412 may contact with the inner rail 4. When the stop hook 41 rotates, the returning elastic arm 412 is pressed and elastic deformation is produced. At this time, the stop pushing surface 411 no longer contacts with the stopper 36 to form a block, and the inner rail 4 may be completely separated from the middle rail 3 to take the whole node module out of the chassis. When the external force is released, the returning elastic arm 412 makes the stop hook 41 restored and plays a role in the blocking function again.

FIG. 1C is a schematic cross-sectional view of a node safe locking device. The two outer rails 1 are fixedly connected backwards. Referring to FIG. 2A, the upper edge and the lower edge of the outer rail 1 are respectively bent backwards to form position-limiting fold edges, that is, the bending directions of the position-limiting fold edges of the two outer rails 1 are away from each other, and the position-limiting fold edges are bent in a U-shaped shape to realize guidance.

The middle rail 3 is slidably assembled in the outer rail 1. Referring to FIG. 2B, an upper edge of the middle rail 3 and a lower edge of the middle rail 3 are respectively bent backwards to form a position-limiting fold edge. The position-limiting fold edge formed by the upper edge of the middle rail 3 and the lower edge of the middle rail 3 and the position-limiting fold edge of the outer rail 1 are the same in shape. The position-limiting fold edge of the middle rail 3 is slidably assembled in the position-limiting fold edges of the outer rail 1.

The upper edges and the lower edges of the main parts of the two inner rails 4 are respectively bent relative to each other to form position-limiting fold edges. Referring to FIG. 2D, the main parts of the two inner rails 4 are respectively stuck into the middle rail 3. The position-limiting fold edges of the inner rails 4 are slidably assembled within the position-limiting fold edges, the bending directions of the position-limiting fold edges of two inner rails 4 are close to each other. The size of the position-limiting fold edges of the main part of the inner rail 4 is equal to the width of the position-limiting fold edge on the middle rail 3.

As shown in FIG. 1C, a U-shaped groove structure is formed by backwards stamping at the middle position of the outer rail 1 and the middle rail 3 respectively; after the two outer rails 1 are butt-jointed and fixed, the U-shaped groove structures of the two outer rails 1 are spliced to form a cavity, the two ends in the length direction of the cavity are penetrated with the outside world, and the unlocking connecting rod 5 mentioned hereinafter is installed in the cavity.

On the basis of any of the above-mentioned technical solutions and their combination, the present disclosure also includes an unlocking connecting rod 5, an extending direction of the unlocking connecting rod 5 is parallel to a moving direction of the node module, and the unlocking connecting rod 5 may move along the length direction. The inner extending end of the unlocking connecting rod 5 is provided with an unlocking lean edge 51, which drives the linking and interlocking rod 2 to move from the locking position to the unlocking position when the unlocking connecting rod 5 moves along an unlocking direction. The linking and interlocking rod 2 may be independently moved to the unlocking state by the unlocking connecting rod 5, thus unlocking the other node modules.

Figure 6A:
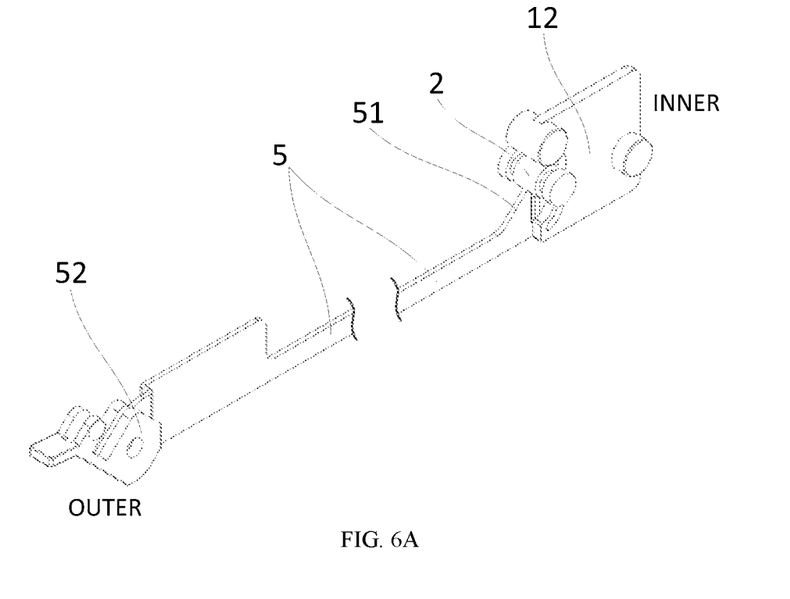
FIG. 6A is a schematic diagram showing the structure of the unlocking connecting rod.
Figure 6B:
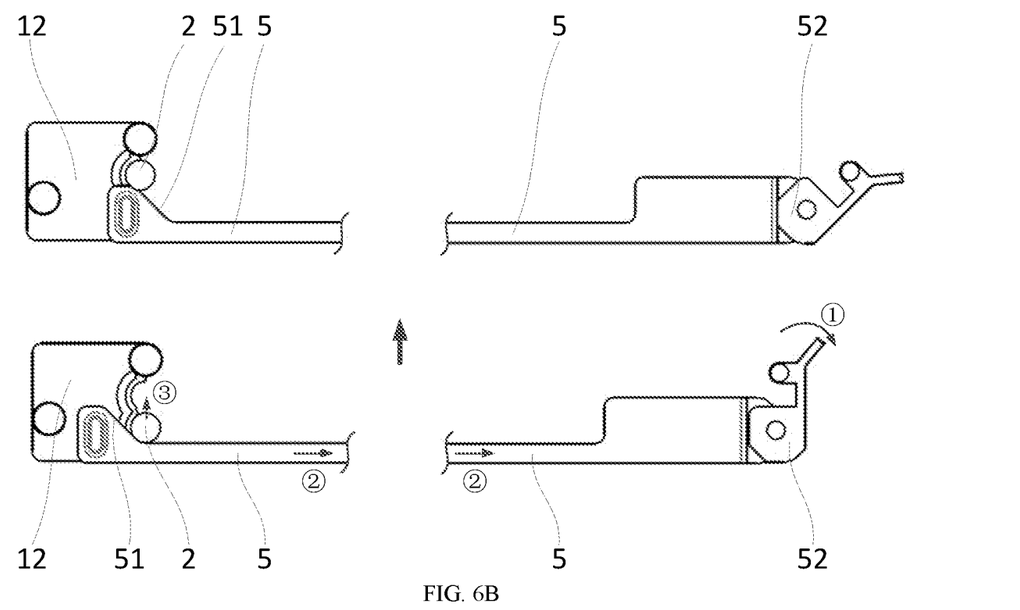
FIG. 6B is a schematic diagram of the process of the unlocking connecting rod pushing the linking and interlocking rod.
Figure 7A:
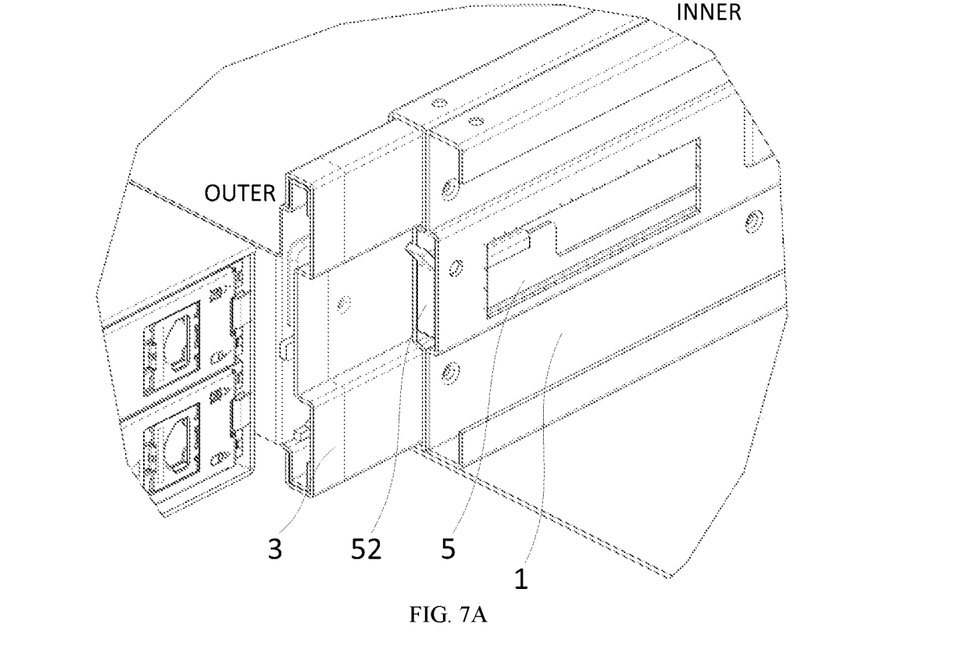
FIG. 7A and FIG. 7B are an outer end partial structure diagram and an inner end partial structure diagram of an unlocking connecting rod in the locking state, respectively.
Figure 7B:
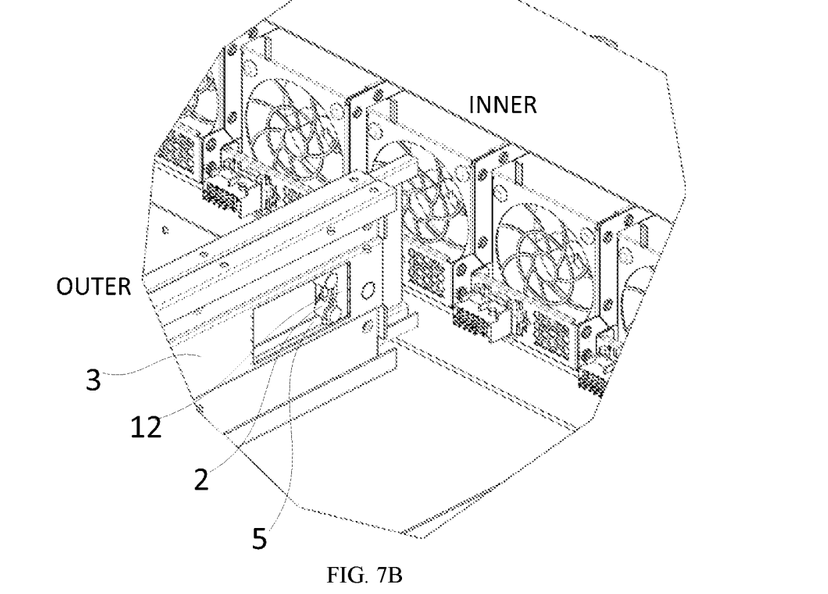
Figure 8A:
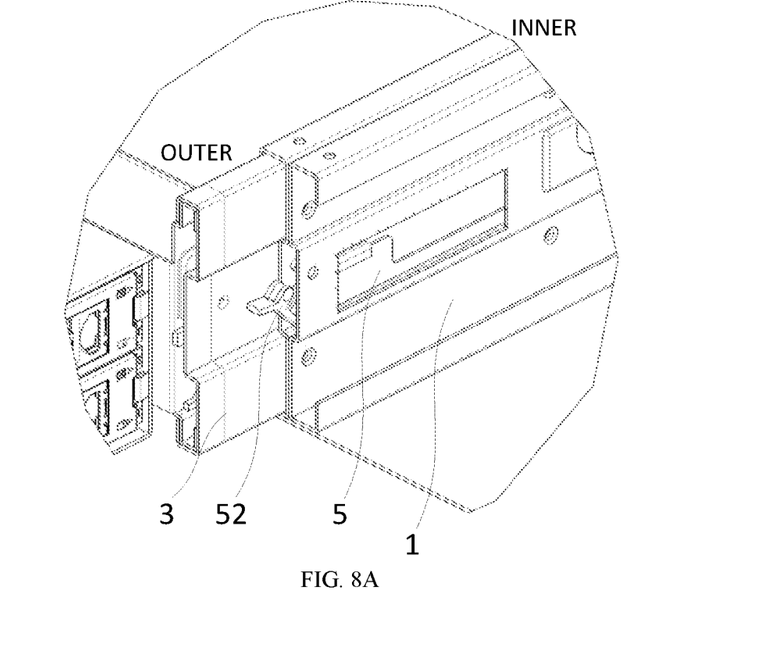
FIG. 8A and FIG. 8B are an outer end partial structure diagram and an inner end partial structure diagram of the unlocking connecting rod in the unlocking state, respectively.
Figure 8B:
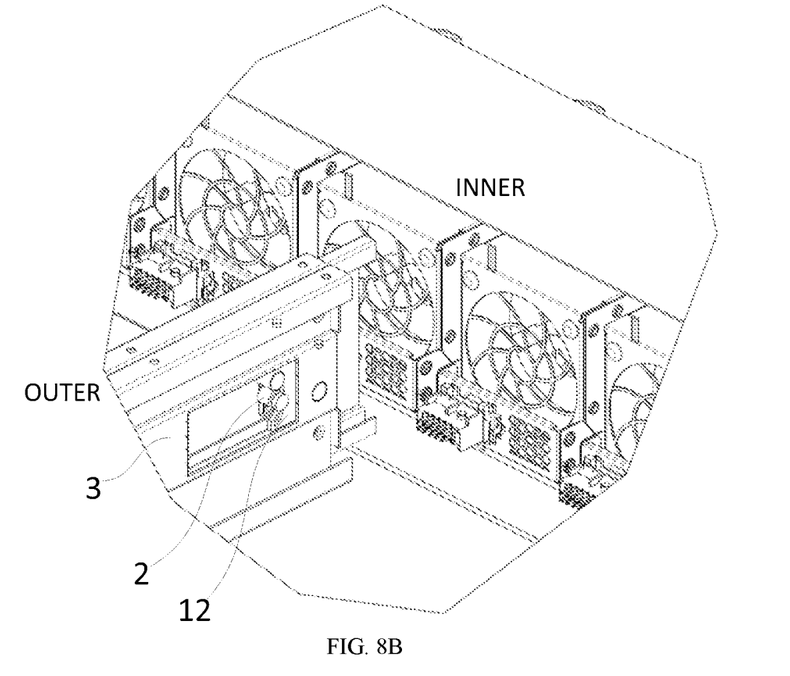

The unlocking direction is parallel to the moving direction of the node module, and the outer extending end of the unlocking connecting rod 5 is rotatably connected to the unlocking handle 52, and when the unlocking handle 52 is rotated, the unlocking connecting rod 5 is driven to move outward in a direction parallel to the node module to realize unlocking As shown in FIG. 6A, FIG. 6A is the structural schematic diagram of the unlocking connecting rod 5. FIG. 6B is a schematic diagram of the process of the unlocking connecting rod 5 pushing the linking and interlocking rod 2. Referring to FIG. 7A and FIG. 7B, FIG. 7A and FIG. 7B are an outer end partial structure diagram and an inner end partial structure diagram of an unlocking connecting rod 5 in the locking state, respectively; FIG. 8A and FIG. 8B are an outer end partial structure diagram and an inner end partial structure diagram of the unlocking connecting rod 5 in the unlocking state, respectively.

The length direction of the unlocking connecting rod 5 is parallel to the moving direction of the node module. As shown in FIG. 6B, the unlocking connecting rod 5 at the lower portion of FIG. 2 is in an unlocking state. The unlocking handle 52 is first turned according to the bent arrow ① to make the unlocking handle 52 contact with the outer rail 1 and make the unlocking connecting rod 5 move along the direction of arrow ② so that the unlocking lean edge 51 pushes the linking and interlocking rod 2 to move along the direction of arrow ③ to reach the state in which the unlocking connecting rod 5 at the upper portion of FIG. 2 is located.

The present disclosure also provides a server including the node safe locking device mentioned above, which is capable of achieving the same technical effect.

The above description of the embodiments disclosed enables a person skilled in the art may realize and use the present disclosure. Various modifications to these embodiments will be obvious to a person skilled in the art. The general principles defined herein may be realized in other embodiments without breaking away from the spirit or scope of the present disclosure. Therefore, the present disclosure will not be limited to these embodiments shown in this specification, but to conform to the widest range consistent with the principles and novel features disclosed in this specification.

The invention claimed is:

1. A node safe locking device, wherein the node safe locking device comprises an outer rail disposed between two adjacent node modules, and the outer rail is provided with a guiding hole,
   a linking and interlocking rod is slidably assembled in the guiding hole, and the linking and interlocking rod is movable in a direction perpendicular to its own axis;
   when the linking and interlocking rod is at a locking position, one of the two adjacent node modules is capable of being pulled out, while the other of the two adjacent node modules remains locked; when the linking and interlocking rod is at an unlocking position, both of the two adjacent node modules are capable of being pulled out; each node module corresponds to one outer rail, and each outer rail corresponds to one middle rail,
   the middle rail is slidably assembled at the outer rail, and the middle rail is driven by one of the two adjacent node modules corresponding to the middle rail to translate in a same direction;
   the middle rail is provided with a locking guiding lean edge, an unlocking guiding lean edge and a blocking locking edge;
   when the middle rail moves outwards from an initial position, the locking guiding lean edge drives the linking and interlocking rod to move to the locking position;
   when the middle rail moves inwards to the initial position, the unlocking guiding lean edge drives the linking and interlocking rod to move to the unlocking position; and
   when the middle rail is located at the initial position, the blocking locking edge is blocked by the linking and interlocking rod at the locking position, so that a corresponding node module is not capable to move outwards.

2. The node safe locking device according to claim 1, wherein a damping block is fixedly assembled at the outer rail, and the damping block is provided with two position-limiting arcs, the damping block is configured to elastically limit the position of the linking and interlocking rod in the locking position and the unlocking position; and
   when the linking and interlocking rod moves between the locking position and the unlocking position, damping is generated.

3. The node safe locking device according to claim 2, wherein a middle rail stop nail is assembled at the middle rail, and the outer rail is provided with a stop guiding edge; and
   when the stop guiding edge blocks the middle rail stop nail, an outermost position that the middle rail moves to is defined.

4. The node safe locking device according to claim 3, wherein the middle rail is slidably connected to an inner rail, and the inner rail is fixedly connected to the node module;
   a stop hook is assembled at the inner rail, and the stop hook is capable to drive the middle rail stop nail to allow the middle rail to move outward together with the node module at the same time;
   the middle rail is provided with a middle rail stop slideway, and the middle rail stop nail is slidably mounted in the middle rail stop slideway and the middle rail stop nail is capable to move to a stop position and a movable position;
   when the middle rail moves outwardly to the outermost position, the stop guiding edge causes the middle rail stop nail to move to the movable position; and
   when the middle rail stop nail is located at the stop position, the middle rail stop nail contacts and cooperates with the stop hook; and when the middle rail stop nail is located at the movable position, the middle rail stop nail stops cooperating with the stop hook, and the inner rail is capable to move independently with respect to the middle rail.

5. The node safe locking device according to claim 4, wherein the inner rail is provided with a stop reset lean edge, and when the inner rail moves inward together with the node module, the stop reset lean edge drives the middle rail stop nail to the stop position.

6. The node safe locking device according to claim 4, wherein a return spring is assembled at the middle rail, and the return spring applies a lifting elastic force to the middle rail stop nail.

7. The node safe locking device according to claim 4, wherein a side surface of the middle rail is protruded with a stopper, and the stopper is closer to an outer extending end compared with the middle rail stop nail; and
   the stopper is configured to block the stop hook to prevent the inner rail from completely separating from the middle rail.

8. The node safe locking device according to claim 7, wherein the stop hook comprises a stop pushing surface, a returning elastic arm, a rotating connecting element, a pressing arm, and the stop pushing surface is configured to achieve a stop function with the cooperation of the middle rail stop nail or the stopper; and the stop hook is rotatably connected to the inner rail through the rotating connecting element; and the stop hook is capable to rotate around the rotating connecting element by pressing the pressing arm, and the returning elastic arm produces elastic deformation by squeezing the returning elastic arm; and when external force is released, the position of the stop hook is restored by the returning elastic arm.

9. The node safe locking device according to claim 4, wherein two outer rails are fixedly connected backwards, and an upper edge the outer rail and a lower edge of the outer rail are respectively bent backwards to form position-limiting fold edges;

an upper edge of the middle rail and a lower edge of the middle rail are respectively bent backwards to form a position-limiting fold edge; and upper edges and lower edges of main parts of two inner rails are respectively bent relative to each other to form position-limiting fold edges; and the position-limiting fold edges of the inner rails are slidably assembled in the position-limiting fold edge of the middle rail.

10. The node safe locking device according to claim 1, further comprising an unlocking connecting rod, and an extending direction of the unlocking connecting rod is parallel to a moving direction of the node module; and an inner extending end of the unlocking connecting rod is provided with an unlocking lean edge and the unlocking lean edge drives the linking and interlocking rod to move from the locking position to the unlocking position when the unlocking connecting rod moves along an unlocking direction.

11. The node safe locking device according to claim 10, wherein an outer extending end of the unlocking connecting rod is rotatably connected to an unlocking handle, and when the unlocking handle is rotated, the unlocking connecting rod is driven to move outward in a direction parallel to the node module to realize unlocking.

12. A server, comprising the node safe locking device according to claim 1.

13. The node safe locking device according to claim 1, wherein each of the two adjacent node modules corresponds to one outer rail, and two outer rails are relatively fixedly arranged to form a whole body.

14. The node safe locking device according to claim 1, wherein the initial position is the position where the middle rail is located when one node module which is capable to be pulled out is completely retracted into a chassis.

15. The node safe locking device according to claim 1, wherein a moving direction of the middle rail is consistent with a length direction of the outer rail.

16. The node safe locking device according to claim 1, wherein the guiding hole penetrates through the outer rail.

17. The node safe locking device according to claim 1, wherein the linking and interlocking rod penetrates through and inserts into the guiding hole.

18. The node safe locking device according to claim 1, wherein the locking guiding lean edge, the unlocking guiding lean edge and the blocking locking edge are external convex structures protruding from a plate surface of the middle rail, and the locking guiding lean edge and the unlocking guiding lean edge are linear-shaped or arc-shaped structures arranged obliquely.

19. A chassis, comprising the node safe locking device according to claim 1.

* * * * *